(12) United States Patent
Oguma et al.

(10) Patent No.: US 10,767,987 B2
(45) Date of Patent: Sep. 8, 2020

(54) SENSOR HEAD FOR CRYSTAL OSCILLATOR TYPE OF FILM THICKNESS MONITOR

(71) Applicant: ULVAC, INC., Kanagawa (JP)

(72) Inventors: Yousuke Oguma, Kanagawa (JP); Akihiro Maeda, Kanagawa (JP); Yuki Kaida, Kanagawa (JP); Manabu Kotaka, Kanagawa (JP); Kou Okamura, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 16/469,210

(22) PCT Filed: Mar. 6, 2018

(86) PCT No.: PCT/JP2018/008466
§ 371 (c)(1),
(2) Date: Jun. 13, 2019

(87) PCT Pub. No.: WO2019/003499
PCT Pub. Date: Jan. 3, 2019

(65) Prior Publication Data
US 2020/0103225 A1    Apr. 2, 2020

(30) Foreign Application Priority Data

Jun. 28, 2017 (JP) .................................. 2017-126694

(51) Int. Cl.
*G01B 17/02* (2006.01)
*C23C 14/52* (2006.01)

(52) U.S. Cl.
CPC .............. *G01B 17/02* (2013.01); *C23C 14/52* (2013.01)

(58) Field of Classification Search
CPC ...... G01B 7/06–066; G01B 17/02–025; C23C 14/546; F02P 7/022
(Continued)

(56) References Cited

U.S. PATENT DOCUMENTS

| 1,584,429 | A | * | 5/1926 | Briscoe | ................... | F02P 7/022 |
| | | | | | | 200/19.08 |
| 2,324,169 | A | * | 7/1943 | Moran | ................... | F02P 7/022 |
| | | | | | | 200/80 R |

(Continued)

FOREIGN PATENT DOCUMENTS

| JP | 3-153872 A | | 7/1991 |
| JP | 2007024909 A | * | 2/2007 |

(Continued)

OTHER PUBLICATIONS

English Translation of JP-2007024909-A (Year: 2007).*

(Continued)

*Primary Examiner* — Alexander A Mercado
(74) *Attorney, Agent, or Firm* — Cermak Nakajima & McGowan LLP; Tomoko Nakajima

(57) ABSTRACT

A sensor head has: a sensor head main body which has disposed therein the stepping motor; a holder which has disposed on an upper surface thereof a plurality of crystal oscillators and which is driven for rotation by the stepping motor; and a mask body which is mounted on the sensor head main body so as to cover an upper surface of the holder and which has opened therein a film-forming window faced by one of the crystal oscillators. The sensor head also has: a first electrode fixed to that portion of the sensor head main body which is located right under the film-forming window; and second electrodes which are in electrical conduction with each of the crystal oscillators and which are disposed to protrude under a lower surface of the holder.

5 Claims, 4 Drawing Sheets

(58) Field of Classification Search
USPC .......................................................... 73/579
See application file for complete search history.

(56) References Cited

U.S. PATENT DOCUMENTS

| | | | | | |
|---|---|---|---|---|---|
| 3,730,136 | A | * | 5/1973 | Okada | B23K 9/1333 |
| | | | | | 118/78 |
| 4,207,836 | A | * | 6/1980 | Nonaka | C23C 14/546 |
| | | | | | 118/664 |
| 4,236,487 | A | * | 12/1980 | Kaplan | C23C 14/54 |
| | | | | | 118/720 |
| 4,323,031 | A | * | 4/1982 | Kaplan | C23C 14/042 |
| | | | | | 118/500 |
| 4,362,125 | A | * | 12/1982 | Schadler | G01B 17/025 |
| | | | | | 118/664 |
| 4,367,579 | A | * | 1/1983 | Kaplan | C23C 14/54 |
| | | | | | 118/301 |
| 4,588,942 | A | * | 5/1986 | Kitahara | C23C 14/546 |
| | | | | | 204/298.03 |
| 5,025,664 | A | | 6/1991 | Kendrick et al. | |
| 5,770,948 | A | * | 6/1998 | Li | B24B 37/013 |
| | | | | | 324/226 |
| 2007/0125303 | A1 | * | 6/2007 | Ruby | C23C 14/505 |
| | | | | | 118/724 |
| 2009/0312206 | A1 | * | 12/2009 | Miyasaka | C21D 7/06 |
| | | | | | 508/154 |
| 2010/0266747 | A1 | * | 10/2010 | Strickland | C23C 14/546 |
| | | | | | 427/8 |
| 2014/0076232 | A1 | * | 3/2014 | Park | C23C 14/12 |
| | | | | | 118/712 |

FOREIGN PATENT DOCUMENTS

| | | |
|---|---|---|
| JP | 2007-170831 A | 7/2007 |
| JP | 3953505 B2 | 8/2007 |
| JP | 2014-070969 A | 4/2014 |
| WO | WO2010/124020 A1 | 10/2010 |

OTHER PUBLICATIONS

International Search Report and Written Opinion for PCT Patent App. No. PCT/JP2018/008466 (dated Jun. 5, 2018).

International Preliminary Report on Patentability for PCT Patent App. No. PCT/JP2018/008466 (dated Jan. 9, 2020).

* cited by examiner

SENSOR HEAD FOR CRYSTAL OSCILLATOR TYPE OF FILM THICKNESS MONITOR

This application is a national phase entry under 35 U.S.C. § 371 of PCT Patent Application No. PCT/JP2018/008466, filed on Mar. 6, 2018, which claims priority under 35 U.S.C. § 119 to Japanese Patent Application No. 2017-126694, filed Jun. 28, 2017, both of which are incorporated by reference.

TECHNICAL FIELD

The present invention relates to a sensor head for a crystal oscillator type of film thickness monitor and relates, in particular, to a sensor head which is disposed inside a vacuum chamber of a film forming apparatus for a vacuum evaporation apparatus, or a sputtering apparatus and the like so as to measure a resonance frequency of the crystal oscillator during film formation in vacuum atmosphere, thereby monitoring the film thickness of a thin film to be formed on this crystal oscillator.

BACKGROUND ART

The sensor head of this kind of crystal oscillator type of film thickness monitor is known, for example, in Patent Document 1. The sensor head in question is provided with a sensor head main body which has disposed therein a stepping motor (pulse motor for use in vacuum) as a driving means, and a holder which has disposed therein a plurality of crystal oscillators in the same circumference at a distance from one another, thereby being driven for rotation by the stepping motor. Provided that the direction from the sensor head main body toward the holder is defined as an upper side, the sensor head main body is provided with a mask body so as to cover that upper surface of the holder on which is disposed each of the crystal oscillators. In a predetermined position of the mask body, there is disposed a film-forming window to which faces one piece of the crystal oscillator.

In that portion of the sensor head main body which is positioned right under the film-forming window, there is disposed a first electrode. The first electrode is constituted by a plate-like member which is fixed, at one end thereof, to a support base provided in the sensor head main body. The holder is constituted by: a holding plate part made of stainless steel having formed, by recessing, on its upper surface a storing part to store therein each of the crystal oscillators; and a ring plate part, made of fluororesin, integrally fixed to a lower surface of the holding plate part. It is thus so arranged that vane type of electrodes which serve as second electrodes for electrical conduction with each of the crystal oscillators are held by the ring plate part. In this case, those parts of the vane type of electrodes which protrude downward from the ring plate part have dome-like contours. In this arrangement, when the holder is rotated by the stepping motor up to a phase (normal phase) in which one of the crystal oscillators and the film-forming window coincide with each other in the vertical direction, the second electrode comes into contact with a free end part of the first electrode, thereby bringing them into electrical conduction. By measuring a resonance frequency of the crystal oscillator in this state, the film thickness of a thin film to be formed on the crystal oscillator can be monitored. Then, for example, when the resonance frequency to be measured varies beyond a predetermined range, with an increase in the film thickness of the thin film to be formed, judgment is made that the crystal oscillator now in use has reached the end of its lifetime. Then, by means of the stepping motor, the holder is rotated once again to the phase in which the next crystal oscillator and the film-forming window coincide with each other in the vertical direction.

By the way, at the time of measuring the resonance frequency, the drive current to cause to flow through the crystal oscillator is generally as small as several mA. Therefore, taking into consideration the fact that the use is made in the vacuum atmosphere, as well as the resistance to corrosion and electrical resistance value, it is normal practice to use, as the first electrode and the second electrode, an article made of gold or an article in which gold-plated layer is formed on the surface of electrically conductive material may be used. However, if the portion of contact between the first electrode and the second electrode is both made of gold, i.e., the same kind of metal, the following findings have been obtained. Namely, the stepping motor is likely to get out of step and also, with an increase in the number of times of rotating the holder, the magnetizing current to flow through the stepping motor in order to drive to rotate the holder keeps on increasing. Then the following problem will occur in that the measurement of the film thickness of the thin film to be formed on the crystal oscillator cannot accurately be monitored: in case the stepping motor gets out of step to thereby give rise to a phase shift of the crystal oscillator relative to the film-forming window (i.e., as a result of deviation in position of stopping of the holder in the front-to-back direction of rotation, the crystal oscillator deviates in the front-to-back direction of rotation relative to the film-forming window) (as long as the resonance frequency does not deviate largely, the presence or absence of stepping out cannot be discriminated); and should the magnetizing current rise and the calorific value of the stepping motor increase, and this heat be received by the crystal oscillator.

Then, as a result of strenuous studies by the inventors of this application, the finding has finally been successfully obtained, especially, in that the above-mentioned phenomena are attributable to the fact that the surface layer portion (made of gold) of the first electrode gets roughened (becomes a surface with projections and recesses). In other words, in a phase in which any one of the crystal oscillators and the film-forming window coincide with each other in the vertical direction, the state of contact between the first electrode and the second electrode will be maintained by the urging force of the first electrode but, since the hardness of gold is relatively low, the contact portion between the first electrode and the second electrode will soon be in a state of getting adhered. If the holder is rotated in this state, the second electrode will slide along the surface of the first electrode in a manner to get peeled off by force. As a result of repetition of this sliding movement, the surface layer portion of the first electrode comes to get gradually roughened. As a consequence, it is considered that, by an increase in the sliding resistance (frictional resistance) of the second electrode relative to the first electrode during rotation of the holder, the stepping motor easily comes to become out of step, and further that the magnetizing current of the stepping motor keeps on increasing.

PRIOR ART DOCUMENTS

Patnet Documents

Patent Document 1: Japanese Patent Gazette P3953505

SUMMARY OF THE INVENTION

Problems that the Invention is to Solve

This invention has been made based on the above-mentioned finding, and has a problem of providing a sensor head for a crystal oscillator type of film thickness monitor in which a phase shift of the crystal oscillator relative to the film-forming window due to stepping out of the stepping motor, and an increase in magnetizing current of the stepping motor can be restrained, and also in which the film thickness of the thin films respectively formed on the crystal oscillators can be constantly and accurately measured.

Means for Solving the Problems

In order to solve the above problems, the sensor head for a crystal oscillator type of film thickness monitor according to this invention includes: a sensor head main body having disposed therein a stepping motor; a holder having disposed therein a plurality of crystal oscillators in the same circumference at a distance from one another, the holder being adapted to be driven for rotation by the stepping motor; provided that a direction from the sensor head main body toward the holder is defined as an upper side, a mask body mounted on the sensor head main body in a manner to cover an upper surface of the holder on which is disposed each of the crystal oscillators, the mask body also having opened therein a film-forming window facing any one of the crystal oscillators. The sensor head further comprises: a first electrode fixed to that portion of the sensor head main body which is positioned right under the film-forming window; and second electrodes respectively in electrical conduction with each of the crystal oscillators, the second electrodes being disposed to protrude out of a lower surface of the holder such that, when the holder is rotated by the stepping motor to a phase in which any one of the crystal oscillators and the film-forming window coincide with each other in a vertical direction, the first electrode and the second electrode, both being made of same kind of metal, come into contact with each other for electrical conduction, wherein a lubricant supply means is disposed for supplying, before the first electrode comes into contact with the second electrode, a surface of at least one of the first electrode and the second electrode with a solid lubricant.

According to the above arrangement, in a phase in which any one of the crystal oscillators and the film-forming window coincide with each other in a vertical direction, the solid lubricant is present in a portion of contact between the first electrode and the second electrode, adhesion at this portion of contact can be restrained. Then, at the time of rotation of the holder, the second electrodes come to smoothly slide on the surface of the first electrode due to the solid lubricant. Therefore, even if the operation of rotating the holder is repeated, roughening on the surface layer portion of the first electrode can be kept as small as possible and, as a result, the sliding resistance of the second electrode relative to the first electrode will not increase during rotation of the holder. The consequence will be that the stepping motor can be restrained from getting out of step, and the magnetizing current of the stepping motor can also be restrained from increasing. As the solid lubricant, there is no limitation to the material and the particle size as long as they do not hinder the function, in addition to the above-mentioned function, of measuring the resonance frequency by bringing the first electrode and the second electrode into contact with each other. Further, this invention shall not be limited to the case in which, as the first electrode and the second electrode, an article made of gold or an article in which gold-plated layer is formed on the surface of electrically conductive material is used, but is also applicable to the case in which the first electrode and the second electrode are constituted by the same kind of metals such as copper, platinum, and the like.

In this invention, preferably the lubricant supply means is disposed adjacent to one of the first electrode and the second electrode, and is constituted by a member having a sliding surface along which the other of the first electrode and the second electrode slides accompanied by the rotation of the holder, and the sliding surface has a Vickers hardness which is lower than that of the other of the first electrode and the second electrode. According to this arrangement, in case, for example, the above-mentioned member is disposed adjacent to the first electrode, by making an arrangement in that: scraped fine powder to be generated when the second electrode slides over the sliding surface of the member is made use of as a solid lubricant; and that the second electrode is made to come into contact with the first electrode in a state in which this kind of scraped fine powder remains adhered to the second electrode. In this arrangement, it is possible to materialize, in a simpler constitution, the lubricant supply means for supplying the surface of the second electrode, before coming into contact with the first electrode, with the solid lubricant. In this case, if the sliding surface of the member is constituted by fluororesin or graphite, it has been confirmed that, in case as the first electrode and the second electrode, the one made of gold or the one in which metallic materials with gold-plated layer is formed on the surface of electrically conductive material, the surface layer portions of the first electrode and the second electrode can be restrained, to the best extent possible, from getting roughened without impairing the function of measuring the resonance frequency.

By the way, if a phase shift of the crystal oscillator occurs relative to the film-forming window when the holder is rotated by the driving means by a predetermined angle of rotation and then stops there, the film thickness of a thin film to be formed on the crystal oscillator cannot be measured accurately. In such a case, it may be considered to provide a detecting means for detecting that the crystal oscillator is in the normal phase relative to the film-forming window. This arrangement, however, gives rise to a problem in that the detecting means cannot be disposed in a limited space inside the vacuum chamber, or that the number of constituent parts increases, thereby bringing about an increase in cost. As a solution, development is expected, without using the detecting means, of a sensor head for a crystal oscillator type of film thickness monitor of a simple constitution which is arranged to be able to monitor the film thickness of a thin film to be formed on a crystal oscillator, only when the crystal oscillator is in the normal phase relative to the film-forming window after the holder has been rotated.

Now, a sensor head for a crystal oscillator type of film thickness monitor according to another embodiment of this invention includes: a sensor head main body with a driving means being disposed therein; a holder having disposed therein a plurality of crystal oscillators in the same circumference at a distance from one another, the holder being adapted to be driven for rotation by the driving means; provided that a direction from the sensor head main body toward the holder is defined as an upper side, a mask body mounted on the sensor head main body in a manner to cover an upper surface of the holder on which is disposed each of the crystal oscillators, the mask body also having opened therein a film-forming window to which faces either one of the crystal oscillators. The sensor head further comprises: a first electrode fixed to that portion of the sensor head main body which is positioned right under the film-forming window; and a second electrode which is in electrical conduction with the respective crystal oscillators and which is disposed to protrude out of a lower surface of the holder such that, when the holder is rotated to a phase in which one crystal oscillator and the film-forming window coincide with each other in a vertical direction, the second electrode comes into contact with the first electrode so as to be in electrical conduction, wherein an insulating body is disposed on both sides, as seen in the direction of rotation of the holder, of one of the first electrode and the second electrode, the insulating body coming into sliding contact with the other of the first electrode and the second electrode.

According to the above, if the crystal oscillator is in the normal phase relative to the film-forming window when the holder has been rotated by the predetermined angle of rotation, the second electrode comes into contact with the first electrode. On the other hand, if the crystal oscillator has given rise to a phase shift, ahead of or behind the direction of rotation of the holder, relative to the film-forming window, the first electrode or the second electrode will only come into contact with the insulator body, but the first electrode and the second electrode will never come into electrical conduction with each other. In this manner, the constitution of disposing the insulating body on both sides, as seen in the direction of rotation of the holder, of the first electrode or the second electrode, substantially serves the function as the detection means for detecting that the holder has been driven to move the crystal oscillator to the normal phase. Only when the crystal oscillator is in the normal phase relative to the film-forming window after the holder has been driven for rotation, the film thickness of the thin film formed on the crystal oscillator can be monitored. By the way, this invention is especially advantageous in case the driving means comprises a stepping motor or a pneumatic rotary actuator.

MODES FOR CARRYING OUT THE INVENTION

With reference to the drawings, by referring to an example of having employed a stepping motor as a driving means, a description will be made of an embodiment of a sensor head for a crystal oscillator type of film thickness monitor of this invention, in which the sensor head is disposed inside a vacuum chamber of a film forming apparatus such as a vacuum evaporation apparatus, a sputtering apparatus, and the like (not illustrated) so that, by measuring the resonance frequency of a crystal oscillator during film forming in vacuum atmosphere, the film thickness of a thin film to be formed on this crystal oscillator can be monitored. In the following description, terms to denote the direction such as upper, lower, and the like shall be understood to be based on the posture in FIG. 1. By the way, since known art may be used as the crystal oscillator, members and elements for measuring the resonance frequency of this crystal oscillator, further detailed explanations inclusive of the method of monitoring the concrete film thicknesses are omitted.

Figure 1:
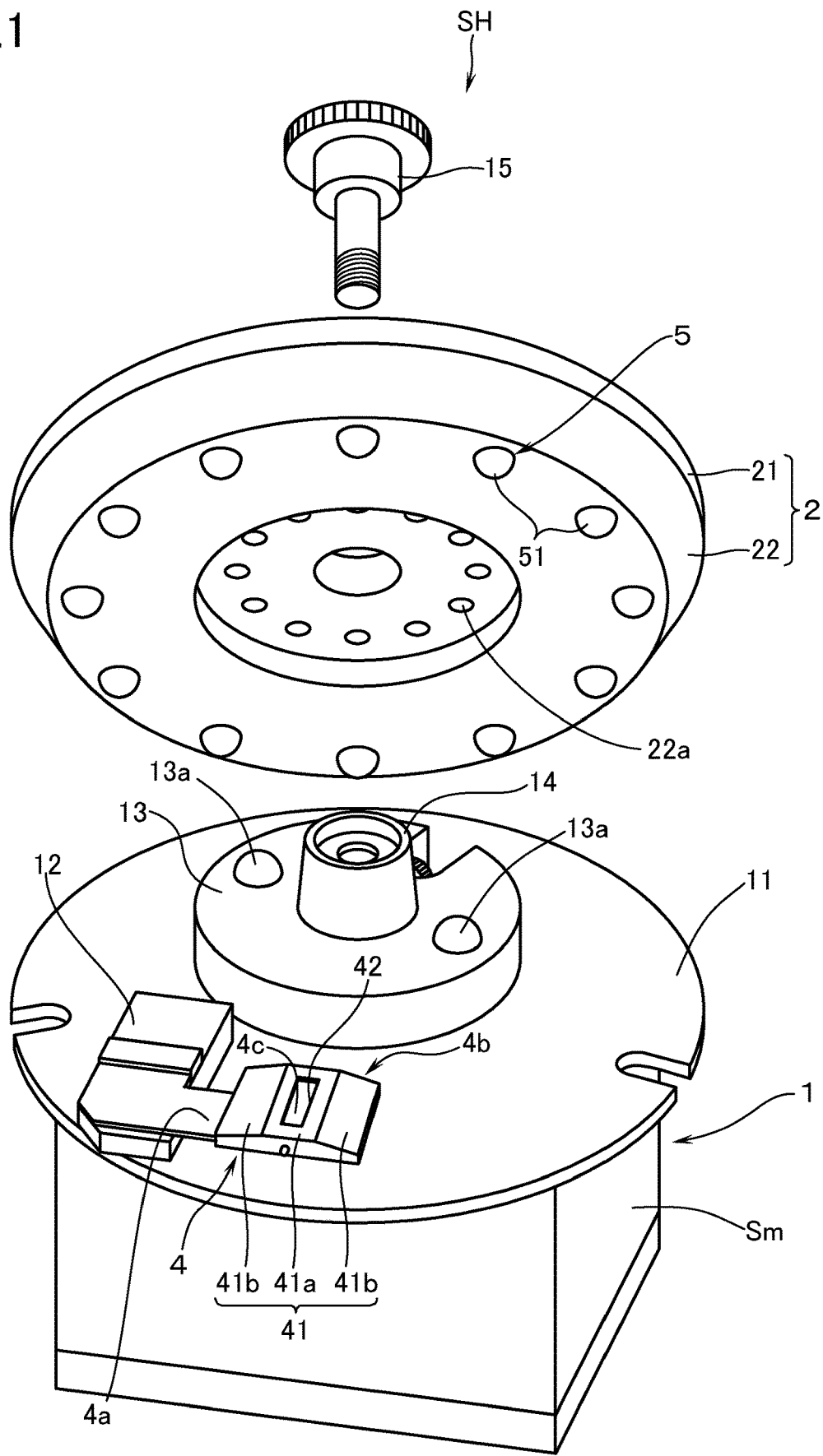
FIG. 1 is an exploded perspective view of a sensor head for a crystal oscillator type of film thickness monitor according to an embodiment of this invention, with a mask body having been omitted.
Figure 2:
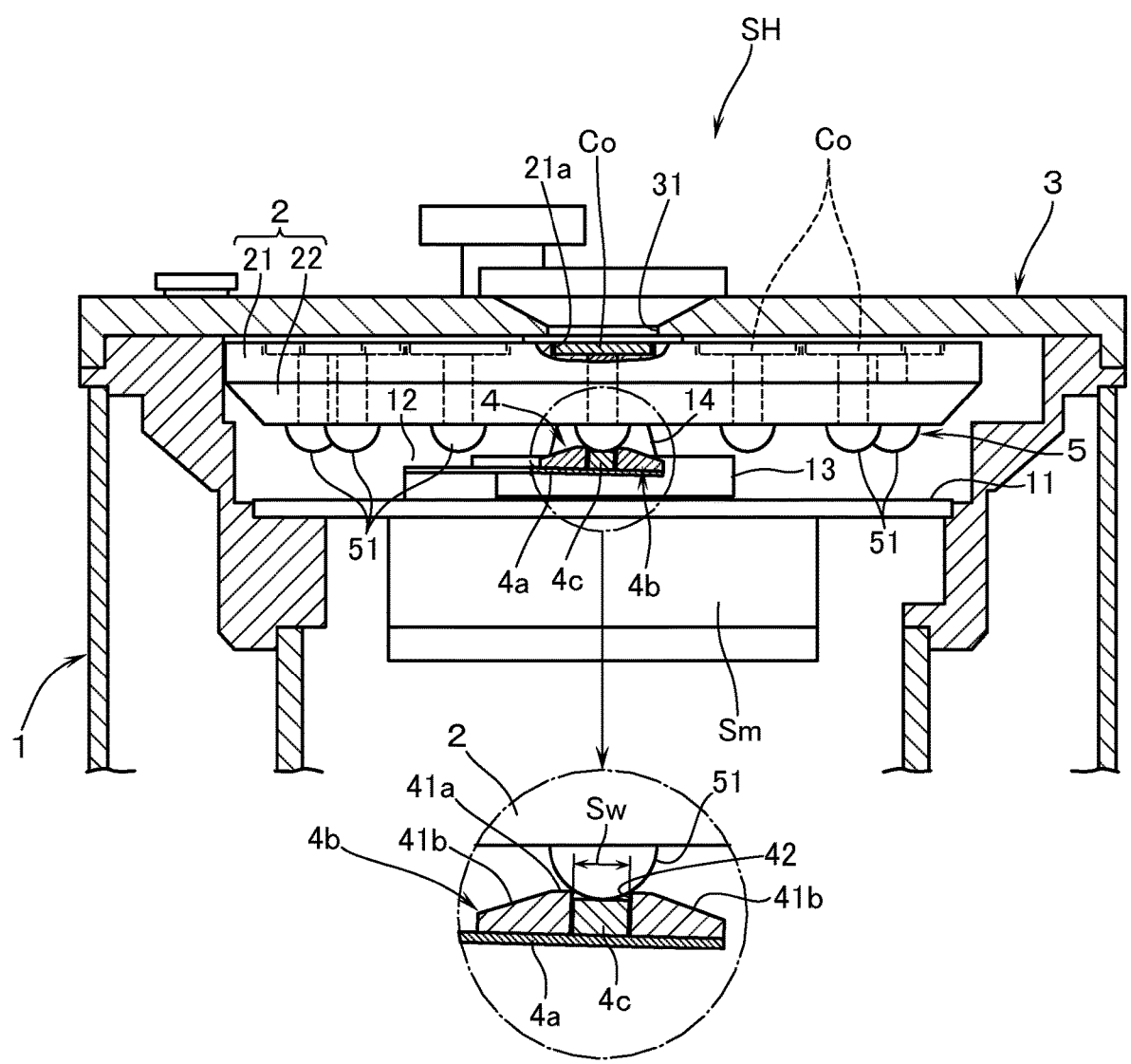
FIG. 2 is a partially sectional drawing of an essential part of the sensor head.
Figure 3:
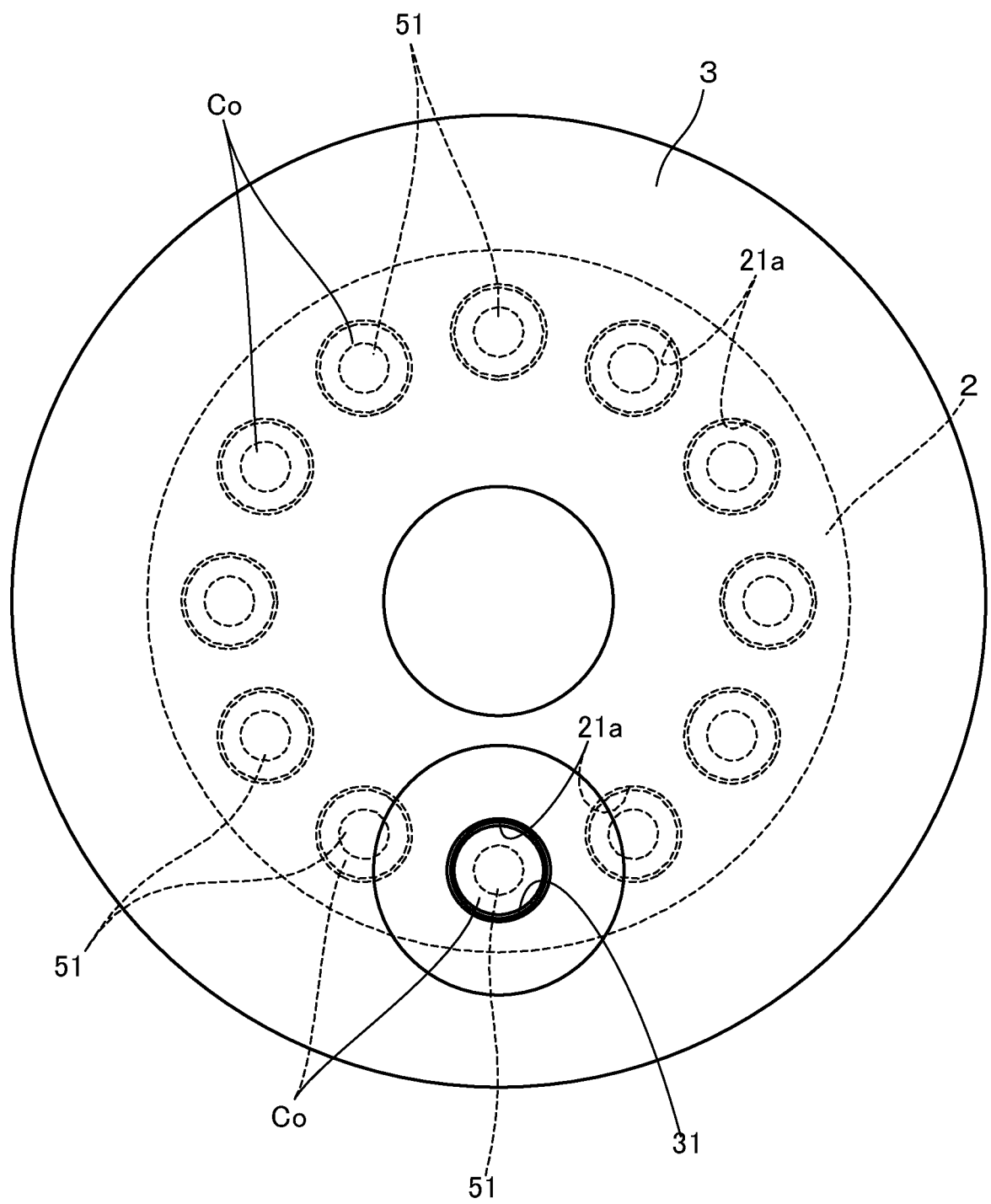
FIG. 3 is a plan view of the sensor head.

With reference to FIG. 1 to FIG. 3, reference characters SH denote a sensor head for the crystal oscillator type of film thickness monitor according to an embodiment of this invention. The sensor head SH is mainly made up of; a sensor head main body 1 which has disposed therein a stepping motor Sm; a holder 2 which has disposed therein a plurality of crystal oscillators Co in the same circumference at the same distance from one another and which is adapted to be driven for rotation by the stepping motor Sm; and a mask body 3 which is mounted on the sensor head main body 1 in a manner to cover an upper surface of the holder 2 on which is disposed each of the crystal oscillators Co, the mask body 3 also having opened therein a film-forming window 31 to which faces any one of the crystal oscillators Co. As the mask body 3, since there may be used known ones, further explanations thereof will be omitted.

On an upper plate part 11 of the sensor head main body 1, there is disposed a first electrode 4. The first electrode 4 has a plate part 4a which is fixed at one end thereof to a supporting base 12 disposed on the upper plate part 11, and is elongated in one direction. In this case, an arrangement is made that the plate part 4a is mounted in a posture to be elongated in a tangential direction of the holder 2, and that a free end part thereof is positioned right under the film-forming window 31 (see FIG. 2). On an upper surface of the free end part of the plate part 4a, there is disposed a sliding plate part 4b as a member having a sliding surface 41 with which a portion 51 of a second electrode 5 (to be described hereinafter) comes into sliding contact. The sliding plate part 4b is formed of a material having (electrical) insulating characteristics and having a Vickers hardness which is lower than that of the portion 51 of the second electrode 5, the sliding plate part being formed, e.g., of fluororesin. In addition, the sliding surface 41 is made up of; a central flat part 41a; and downwardly inclined surface parts 41b, 41b which are respectively formed in continuation to both sides in tangential direction of the flat part 41a.

The flat part 41a has formed therein a slit hole 42 which is elongated in a direction perpendicular to the tangential direction, and which penetrates the flat part in the direction of the plate thickness. The slit hole 42 has fitted therein a contact member 4c which is of a square column shape vertically disposed in the plate part 4a. In this case, the height of the contact member 4c from the plate part 4a is arranged to be cut to size so that the upper surface of the contact member 4c is positioned slightly under the upper surface of the central flat part 41a. As the plate part 4a and the contact member 4c, there is used one in which gold-plating layer is formed on a surface of metal which is relatively inexpensive and has good electrical conductivity such as aluminum, copper, and the like. Still furthermore, the slit width Sw (substantially coinciding with the width, in the tangential direction, of the contact member 4c) of the slit hole 42 is appropriately set, depending on the area of contact of the portion 51 of the second electrode 5 with the contact member 4c, within a predetermined range in which the portion 51 of the second electrode 5 is capable of contacting the upper surface of the contact member 4c that is exposed out of the slit hole 42, only when any one of the crystal oscillators Co and the film-forming window 31 are in the normal phase in which they vertically coincide with each other.

In the central part of the upper plate part 11, although not explained by particularly illustrating, there is formed a through hole for inserting a rotary shaft of the stepping motor Sm assembled, through a bearing, to the sensor head main body 1. In that portion of the rotary shaft which protrudes, through the through hole, beyond the upper plate portion 11, there is mounted a seat part 13 for seating the holder 2 thereon. The seat part 13 is provided, in a projecting manner, with a boss part 14 positioned on an axial line of the rotary shaft. It is thus so arranged that the holder 2 is connected to the rotary shaft of the stepping motor Sm by means of a locking screw 15 penetrating through the holder 2 via the boss part 14. In addition, the seat part 13 is provided with two projected parts 13a having dome-shaped contour on the same circumference with 180 degrees of deviation from each other. When each of the projected parts 13a gets engaged with engaging hole parts 22a that are provided on the lower surface of the ring plate part 22 in the holder 2 which will be described in detail hereinafter, the holder 2 is arranged to be fixed both in position and in phase, relative to the sensor head main body 1.

The holder 2 is constituted by: a holder plate part 21, made of stainless steel, having on an upper surface of the holder a recessed container part 21a for respectively containing therein plural sheets (12 sheets in this embodiment) of crystal oscillators; and a ring plate part 22, made of fluororesin, integrally fixed to the lower surface of the holder plate part 21. The central hole in the ring plate part 22 is fitted into the seat part 13 so that the holder 2 comes to be seated on the seat part 13. Further, in the ring plate part 22 there are held vane type of electrodes as the second electrodes 5 which come into electrical conduction with the crystal oscillators Co respectively contained in the container part 21a. By the way, as the constitution of the vane type of electrode itself, and the construction of holding by the ring plate part 22 in a state of electrical conduction with the crystal oscillator Co, there can be used known ones. Therefore, detailed explanations thereof are omitted here. Also regarding the vane type of electrode, there is used an article which is made by forming a gold plating layer on the surface of metal such as aluminum, copper, and the like which is relatively inexpensive and having good electrical conductivity. The lower end of the vane type of electrode protrudes downward out of the ring plate part 22. That portion 51 of the second electrode 5 which is protruded and having a dome-shaped profile comes to be in contact with the upper surface of the contact member 4c for electrical conduction with the upper surface of the contact member 4c.

When the film thickness of a thin film to be formed on the crystal oscillator Co is monitored with the above-mentioned sensor head SH, first, after having obtained an origin of the stepping motor Sm by a known method, a pulse signal that has been set in advance is inputted. According to this pulse signal, the holder 2 is rotated by the stepping motor Sm by a predetermined angle of rotation. In this case, there will be attained a state in which the holder 2 is stopped at a position of normal phase in which any one of the crystal oscillators Co and the film-forming window 31 vertically coincide with each other. At the time of rotation of the holder 2, the portion 51 of the second electrode 5 first comes into contact with that inclined surface part 41b of the slide plate part 41 which is positioned on a forward side in the direction of rotation of the holder 2. Accompanied by a further rotation of the holder 2, the portion 51 of the second electrode 5 will come into sliding contact with the inclined surface part 41b and a flat part 41a of the sliding plate part 41, successively, and keeps on moving to the position of contact with the contact member 4c of the first electrode 4. Then, scraped fine powder to be generated at the time of successive sliding contacts with the inclined surface part 41b and the flat part 41a, will get adhered to the portion 51 of the second electrode 5. It follows that, in the normal phase, this kind of scraped fine powder (not illustrated) will be present in the contact portion between the contact member 4c of the first electrode 4 and the portion 51 of the second electrode 5.

Then, if the resonance frequency to be measured varies beyond a predetermined range as a result of an increase in, e.g., the film thickness of the thin film to be formed, any one of the crystal oscillators Co is judged to have reached the end of its lifetime. Then, a pulse signal set in advance will be inputted once again and, correspondingly, the holder 2 will be further rotated by the stepping motor Sm by a predetermined angle of rotation. In this case, the state will be that the holder 2 is stopped at the position of normal phase in which the next crystal oscillator Co and the film-forming window 31 coincide with each other in the vertical direction. At this time, in the same manner as above, scraped fine powder will be present in the contact portion between the contact member 4c of the first electrode 4 and the portion 51 of the second electrode 5. This kind of operation will be repeated hereinafter.

According to the above arrangement, the scraped fine powder to be generated by the sliding movement of the portion 51 of the electrode 5 with the sliding surface 41 of the sliding plate part 4b is utilized as a solid lubricant. In the normal phase in which any one of the crystal oscillators Co and the film-forming window 31 vertically coincide with each other, the solid lubricant is present in the contact portion between the contact member 4c of the first electrode 4 and the portion 51 of the second electrode 5. Therefore, adhesion at this contact portion can be restrained. Then, during rotation of the holder 2, by means of the solid lubricant, the portion 51 of the second electrode 5 comes to be in smooth sliding contact with the upper surface of the contact member 4c of the first electrode 4. As a result, even if the operation of rotating to drive the holder 2 is repeated, the roughening of the surface layer portion of the upper surface of the contact member 4c can be restrained to the best extent possible, and the sliding resistance will not increase. As a result, the stepping motor Sm can be restrained from getting out of step. In addition, the increase in the magnetizing current in the stepping motor Sm can also be restrained. Still furthermore, if the stopping position of the holder 2 is deviated in the front-to-back direction of rotation (i.e., is deviated from the normal phase), the portion 51 of the second electrode 5 will be in a state of being without contact with the upper surface contact part 4c of the first electrode 4, but will be in a state of being in contact with the sliding surface 41 of the sliding plate part 4b as an insulating body. In this case, the measurement of the resonance frequency becomes impossible and, e.g., the film thickness monitor itself will be stopped as an error. In this manner, according to this embodiment, while the sliding plate part 4b constitutes the solid lubricant supply means, it also comes to serve the purpose of detection means for detecting, at the time of rotation of the holder 2, that the holder has substantially been driven for rotation for the crystal oscillator Co to reach the normal phase relative to the film-forming window 31.

In order to confirm the above-mentioned effects, the following experiments were performed by using: the sensor head SH (article of this invention) according to the above-mentioned embodiment; and a sensor head (prior art article: corresponding to the above-mentioned conventional example) in which the first electrode is constituted only by the plate part 4b. In other words, in the vacuum atmosphere, the operation is repeated in which each of the crystal oscillators Co is rotated by the stepping motor Sm in the vacuum atmosphere in one direction by a predetermined angle of rotation each time and then stops so that each of the crystal oscillators Co coincide successively with the film-forming window 31 in the vertical direction. Then, the relationship between: the number of rotation in which the holder is rotated (when the holder is rotated 360 degrees, it is counted as one revolution); and the magnetizing current of the stepping motor Sm was investigated. According to this investigation, it was confirmed that, in the conventional example, the holder 2 could not be driven for rotation if the electric current about 60% of the maximum excitation current of the stepping motor Sm was not caused to be applied at the time of rotation of 1000 revolutions of the holder. In this case, it was confirmed that the resonance frequency varied due to the influence of heat from the stepping motor Sm. On the other hand, according to the invention article, it was confirmed that, even at the point of time of having rotated the holder 2 for 1000 revolutions, the holder 2 was able to be rotated with the electric current of about 15% of the maximum magnetizing electric current and, in addition, that the variation of the resonance frequency did not change much.

Descriptions have so far been made of an embodiment of this invention, but this invention shall not be limited to the above, but modifications can be made within a range in which the technical idea of this invention is not departed from. In the above-mentioned embodiment, descriptions have been made of an example in which the contact member 4c of the first electrode 4 and the portion 51 of the second electrode 5 were made of gold. This invention may, however, also be applicable to a case in which the first electrode and the second electrode are constituted by the same kind of metals such as copper, platinum, and the like.

Further, in the above-mentioned embodiments, descriptions have been made of an example in which the sliding plate part 4b constitutes the solid lubricant supply means, but this invention shall not be limited to the above. For example, a spraying means for spraying the portion 51 of the second electrode 5 with fine particles of a predetermined particle size, or a coating means for coating the portion 51 of the second electrode 5 with fine particles of a predetermined particle size may be disposed on the upper plate part 11 of the monitor main body in order to constitute the solid lubricant supply means. In this case, the solid lubricant may be so arranged as to be supplied not only to the portion 51 of the second electrode 5 but also to the upper surface of the contact member 4c. Furthermore, in the above-mentioned embodiment, descriptions have been made of an example in which the sliding plate member 4b is constituted by fluororesin as an electrical insulating member. However, it is enough if at least the sliding surface 41 is constituted by fluororesin. Still furthermore, in case the sliding plate part 4b is caused to be functioned only as the solid lubricant supply means, the sliding surface 41 need not be of an electrical insulation body and, instead, may be constituted, e.g., by graphite. In such a case, as the stepping motor Sm, a resolver type having the function of detecting the angle of rotation may be used. On the other hand, the driving means may be constituted by one having a pneumatic type of rotary actuator. In this case, as mentioned above, a constitution may be employed in which an insulation body is disposed on both sides, as seen in the direction of rotation, of the holder 2 of the first electrode 4. Then, there is advantageously no need of separately disposing a detecting means for detecting that the holder 2 has been driven for rotation such that the crystal oscillator Co is in the normal phase relative to the film-forming window 31.

Figure 4:
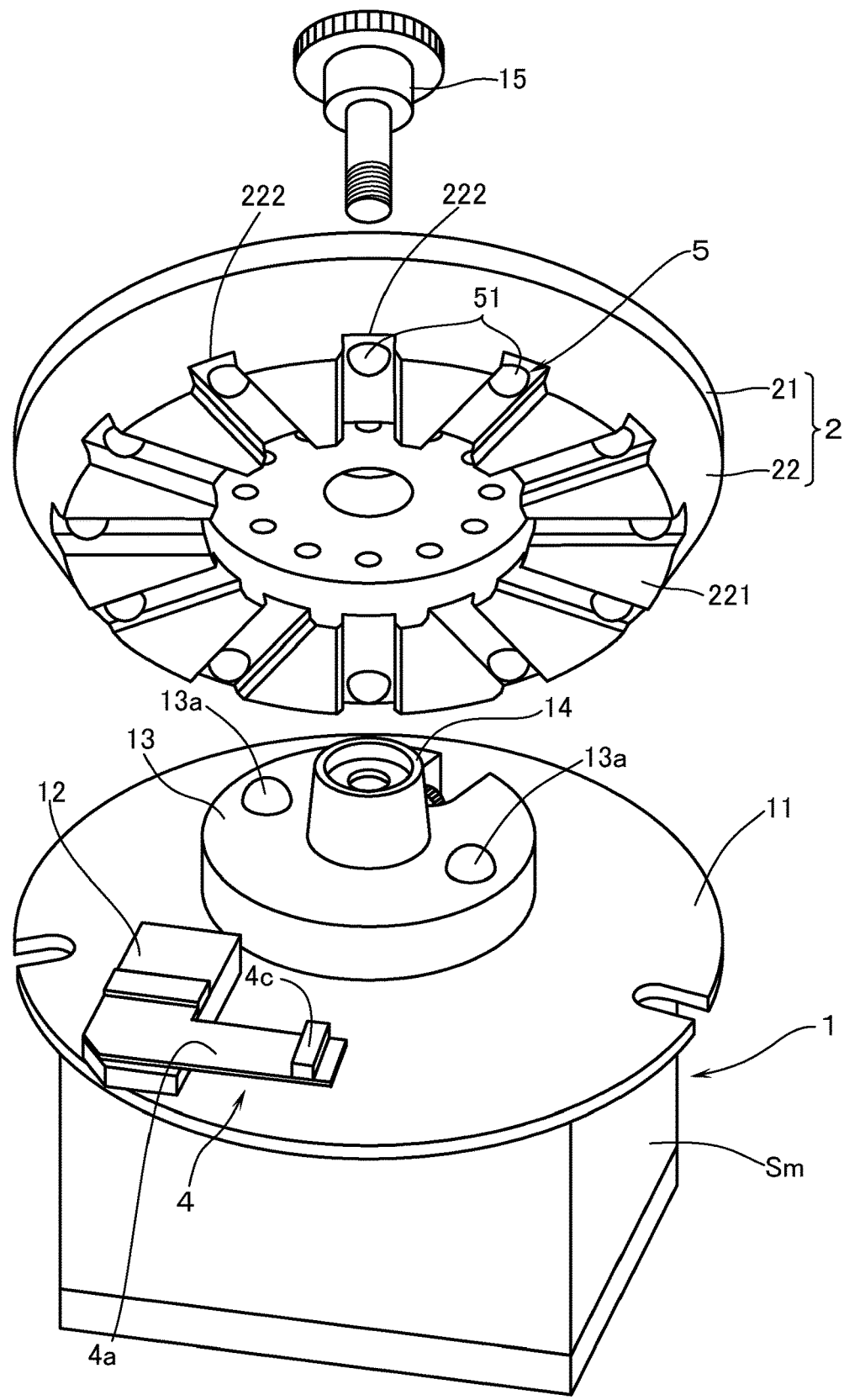
FIG. 4 is an exploded perspective view of the sensor head for a crystal oscillator type of film thickness monitor according to a modified example of this invention, with a mask body having been omitted.

Further, in the above-mentioned embodiment, a description was made of an example in which is disposed, on an upper surface of the free end part of the plate part 4a, the sliding plate part 4b having the sliding surface 41 along which the portion 51 of the second electrode 5 slides is disposed. Scraped fine powder to be generated by the sliding of the portion 51 of the electrode 5 along the sliding surface 41 of the sliding plate part 4b is utilized as a solid lubricant. However, this invention shall not be limited to the above. In a modified example of the embodiment of this invention as shown in FIG. 4, an arrangement may be made such: that a plurality of radially elongated slit-shaped recessed parts 222 are formed in the lower surface 221 of the ring plate part 22 made of fluororesin; that a lower end of each of the vane type of electrodes is made to protrude downward into the recessed parts 222; and that those protruded portions 51 of the second electrodes 5 which have dome-shaped profile may be arranged to be brought into contact with the upper surface of the contact member 4c. In this case, in the plate part 4a only the plasmatic contact member 4c is vertically disposed. In this arrangement, when the holder 2 is driven for rotation, the scraped fine powder to be generated as a result of sliding contact of the contact member 4c with the lower surface 221 of the ring plate part 22 is utilized as a solid lubricant. In the normal phase in which any one of the crystal oscillators Co and the film-forming window 31 coincide with each other in the vertical direction, the solid lubricant comes to be present in the contact portion between the contact member 4c of the first electrode 4 and the portion 51 of the second electrode 5. Further, since the portion 51 of the second electrode 5 is present inside the slit-shaped recessed part 222, in a similar manner as in the above-mentioned embodiment, the portion 51 of the second electrode 5 comes to serve the role of a detecting means for detecting that the holder has been driven for rotation such that the crystal oscillator Co is in the normal phase relative to the film-forming window 31. By the way, in the above-mentioned modified example, slit-shaped recesses 222 are formed and inside these recesses 222 the lower ends of the vane type of electrodes are protruded downward. However, without being limited to the above, protruded parts may be formed at a predetermined position of the lower surface 221 of the ring plate part 22 made of fluororesin, and the lower ends of the vane type of electrodes may be protruded downward.

EXPLANATION OF REFERENCE CHARACTERS

SH sensor head for crystal oscillator type of film thickness monitor
1 sensor head main body
2 holder 3 mask body
31 film-forming window 4 first electrode 4a plate part
4b sliding plate part having electrical insulating characteristics (solid lubricant supply means)
4c contact member (constituting element of first electrode)
41 sliding surface
5 second electrode (vane type of electrode)
51 portion of the second electrode
Sm stepping motor Co crystal oscillator

The invention claimed is:

1. A sensor head for a crystal oscillator type of film thickness monitor, including:
   a sensor head main body having disposed therein a stepping motor;
   a holder having disposed therein a plurality of crystal oscillators in a same circumference at a distance from one another, the holder being adapted to be driven for rotation by the stepping motor;
   provided that a direction from the sensor head main body toward the holder is defined as an upper side, a mask body mounted on the sensor head main body in a manner to cover an upper surface of the holder on which is disposed each of the crystal oscillators, the mask body also having opened therein a film-forming window facing any one of the crystal oscillators, the sensor head further comprising:
      a first electrode which is provided onto a plate part that is fixed at one end thereof to a supporting base and that is elongated in a tangential direction of the holder, which is fixed to that portion of the sensor head main body which is positioned directly under the film-forming window; and second electrodes respectively in electrical conduction with each of the crystal oscillators, the second electrodes being disposed to protrude out of a lower surface of the holder such that, when the holder is rotated by the stepping motor to a phase in which any one of the crystal oscillators and the film-forming window coincide with each other in a vertical direction, the first electrode and the second electrodes, both being made of same kind of metal, come into contact with each other for electrical conduction,
   wherein a sliding plate part is provided onto the plate part and is disposed for supplying, before the first electrode comes into contact with one of the second electrodes, a surface of the second electrodes with a solid lubricant by sliding the second electrodes with urging force of the plate part.

2. The sensor head for a crystal oscillator type of film thickness monitor according to claim 1,
   wherein the sliding plate part has a sliding surface along which the second electrodes slide accompanied by the rotation of the holder,
   wherein the sliding surface has a Vickers hardness which is lower than that of the second electrodes, and has a central flat part and inclined surface parts which are respectively formed in continuation with opposite sides of the flat part.

3. The sensor head for a crystal oscillator type film thickness monitor according to claim 2, wherein the sliding surface of the member is constituted by fluororesin or graphite.

4. A sensor head for a crystal oscillator type of film thickness monitor, including:
   a sensor head main body with a stepping motor SM or a pneumatic rotary actuator being disposed therein;
   a holder having disposed therein a plurality of crystal oscillators in a same circumference at a distance from one another, the holder being adapted to be driven for rotation by the stepping motor SM or the pneumatic rotary actuator;
   provided that a direction from the sensor head main body toward the holder is defined as an upper side, a mask body mounted on the sensor head main body in a manner to cover an upper surface of the holder on which is disposed each of the crystal oscillators, the mask body also having opened therein a film-forming window to which faces any one of the crystal oscillators, the sensor head further comprising:
      a first electrode fixed to that portion of the sensor head main body which is positioned directly under the film-forming window; and
      a second electrode which is in electrical conduction with the respective crystal oscillators and which is disposed to protrude out of a lower surface of the holder such that, when the holder is rotated to a phase in which one crystal oscillator and the film-forming window coincide with each other in a vertical direction, the second electrode comes into contact with the first electrode so as to be in electrical conduction,
   wherein an insulating body is disposed on both sides, as seen in the direction of rotation of the holder, of one of the first electrode and the second electrode, the insulating body coming into sliding contact with the other of the first electrode and the second electrode, and
   wherein a flat part is formed at a top of the first electrode and defines an upper surface of the flat part,
   a hole is formed at the flat part,
   a contact member is formed in the hole, and
   an upper surface of the contact member is positioned so that a distance between the upper surface of the contact member and the lower surface of the holder is larger than a distance between the upper surface of the flat part and the lower surface of the holder.

5. A sensor head for a crystal oscillator type of film thickness monitor, including:
   a sensor head main body having disposed therein a stepping motor;
   a holder having disposed therein a plurality of crystal oscillators in a same circumference at a distance from one another, the holder being adapted to be driven for rotation by the stepping motor;
   provided that a direction from the sensor head main body toward the holder is defined as an upper side, a mask body mounted on the sensor head main body in a manner to cover an upper surface of the holder on which is disposed each of the crystal oscillators, the mask body also having opened therein a film-forming window facing any one of the crystal oscillators, the sensor head further comprising:
      a first electrode fixed to that portion of the sensor head main body which is positioned directly under the film-forming window; and second electrodes respectively in electrical conduction with each of the crystal oscillators, the second electrodes being disposed to protrude out of a lower surface of the holder such that, when the holder is rotated by the stepping motor to a phase in which any one of the crystal oscillators and the film-forming window coincide with each other in a vertical direction, the first electrode and the second electrodes, both being made of same kind of metal, come into contact with each other for electrical conduction, wherein
- the holder further has a ring plate part with a lower surface thereof,
- a plurality of radially elongated slit-shaped recessed parts is formed in the lower surface of the ring plate part, and
- a lower end of each of the second electrodes is made to protrude downward into the recessed part.

* * * * *